(12) United States Patent
Resnick et al.

(10) Patent No.: US 12,129,167 B1
(45) Date of Patent: Oct. 29, 2024

(54) INTERLOCKING PROOF MASS FOR MEMS INERTIAL SENSING DEVICE

(71) Applicant: National Technology & Engineering Solutions of Sandia, LLC, Albuquerque, NM (US)

(72) Inventors: Paul J. Resnick, Albuquerque, NM (US); Brian D. Homeijer, Albuquerque, NM (US); Thomas A. Friedmann, Albuquerque, NM (US); Katherine M. Musick, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 458 days.

(21) Appl. No.: 17/728,004

(22) Filed: Apr. 25, 2022

Related U.S. Application Data

(60) Provisional application No. 63/189,311, filed on May 17, 2021.

(51) Int. Cl.
*G01P 15/03* (2006.01)
*B81B 3/00* (2006.01)

(52) U.S. Cl.
CPC .......... *B81B 3/0021* (2013.01); *G01P 15/03* (2013.01); *B81B 2201/0235* (2013.01)

(58) Field of Classification Search
None
See application file for complete search history.

(56) References Cited

U.S. PATENT DOCUMENTS

2002/0189355 A1* 12/2002 Leonardson .......... G01P 15/001
73/514.32

OTHER PUBLICATIONS

Wooldridge, J. et al., "Finite Element Analysis of the Vertical Levitation Force in an Electrostatic MEMS Comb Drive Actuator," Journal of Physics: Conference Series (2013) 472:012002, 6 pages.

* cited by examiner

*Primary Examiner* — Robert K Carpenter
(74) *Attorney, Agent, or Firm* — Mark A. Dodd

(57) ABSTRACT

A microelectromechanical systems (MEMS) inertial sensing device having a large proof mass with interlocking tabs is disclosed. The interlocking tabs limit motion of the proof mass when subjected to large inertial forces. The interlocking tabs are formed around the periphery of the proof mass and interact with corresponding interlocking tabs formed in a frame to which the proof mass is tethered. The motion of the proof mass is limited by the interlocking tabs, which are formed during MEMS fabrication of the inertial sensing device rather than as part of the packaging process. With a large proof mass, the inertial sensing device can provide high sensitivity in low inertial force environments while the interlocking tabs protect the device when subjected to high inertial forces.

20 Claims, 8 Drawing Sheets

INTERLOCKING PROOF MASS FOR MEMS INERTIAL SENSING DEVICE

RELATED APPLICATIONS

This application claims priority to U.S. Provisional Application No. 63/189,311, filed on May 17, 2021, and entitled INTERLOCKING PROOF MASS FOR MEMS INERTIAL SENSING DEVICE, the entirety of which is incorporated herein by reference.

STATEMENT OF GOVERNMENT INTEREST

This invention was made with Government support under Contract No. DE-NA0003525 awarded by the United States Department of Energy/National Nuclear Security Administration. The Government has certain rights in the invention.

TECHNICAL FIELD

The present invention relates to a microelectromechanical systems (MEMS) inertial sensing device, e.g., an accelerometer, that employs multiple interlocking tabs and corresponding recesses around the periphery of a large proof mass to limit motion of the proof mass when subjected to large inertial forces. The present invention also relates to methods of manufacturing the MEMS inertial sensing device.

BACKGROUND

Inertial sensing devices, for example, accelerometers, are used to detect motion in one or more directions. MEMS technology has been leveraged to manufacture many different types of sensors and actuators, including accelerometers. Further, these devices have become commercially important, for example, in the deploying of airbags in vehicles. Miniaturization of these devices offers the potential for lower cost, higher throughput, and higher sensitivity.

Applications requiring very high sensitivity may employ MEMS technology-based inertial sensing devices having large proof masses. One problem encountered with the use of large proof masses is the need to limit the motion of the large proof mass when the devices are subjected to large inertial forces. In prior art devices, external elements limited the motion of the large proof mass. These external elements may, for example, be bump stops placed above and below the large proof mass. Because these bump stops are external to the proof mass, manufacturing of the overall device may be difficult as spacing between the proof mass and the bump stops is difficult to control.

Alternative prior art inertial sensing devices relied upon the flexures tethering the proof mass to a surrounding frame to limit motion of the proof mass. While such flexures may be able to provide the restoring force necessary for smaller proof masses or smaller inertial forces, such flexures can fail when large proof masses, such as those needed for high sensitivity applications, are employed.

Thus, the need exists for a way to accurately limit motion of large proof masses without relying upon fragile flexures or difficult to control post fabrication processes.

SUMMARY

One aspect of the present invention relates to a MEMS inertial sensing device having a large proof mass with interlocking tabs and corresponding recesses to limit motion of the proof mass when subjected to large inertial forces. The interlocking tabs and corresponding recesses are formed around the periphery of the proof mass, with the interlocking tabs interacting with corresponding interlocking tabs formed in a frame to which the proof mass is tethered. The motion of the proof mass is thus limited by features formed during MEMS fabrication of the inertial sensing device rather than as part of the packaging process. By employing a large proof mass, the inertial sensing device can provide high sensitivity in low inertial force environments while the interlocking tabs protect the device when subjected to a high inertial force.

Another aspect of the present invention relates to a fabrication process for a MEMS inertial sensing device having a large proof mass with interlocking tabs to limit motion of the proof mass. The interlocking tabs are fabricated as part of the MEMS fabrication process as opposed to being part of a post fabrication process, for example, the device packaging process.

In at least one embodiment of the present invention, an inertial sensing device comprises a proof mass (the proof mass including N proof mass interlocking tabs formed around a periphery of the proof mass [where N is an integer greater than 1], and N proof mass recesses formed around the periphery of the proof mass), a frame (the frame including an orifice therethrough, N frame interlocking tabs formed around a periphery of the orifice [each of the N frame interlocking tabs adapted to fit in a respective one of the N proof mass recesses], N frame recesses formed around the periphery of the orifice [each of the N proof mass interlocking tabs adapted to fit in a respective one of the N frame recesses], and a plurality of electrostatic pick-offs formed around the periphery of the orifice), and a plurality of flexures (a first end of each of the plurality of flexures coupled to the proof mass, a second end of each of the plurality of flexures coupled to the frame, the plurality of flexures allowing motion of the proof mass in a direction normal to a plane of the frame, the plurality of flexures inhibiting motion of the proof mass in a direction parallel to the plane of the frame).

In other inertial sensing devices, each of the proof mass and the frame includes a first doped semiconductor layer, a first insulating layer adjacent the first doped semiconductor layer, a first doped primary semiconductor substrate adjacent the first insulating layer, a eutectic metal layer adjacent the first doped primary semiconductor substrate, a second doped primary semiconductor substrate adjacent the eutectic metal layer, a second insulating layer adjacent the second doped primary semiconductor substrate, and a second doped semiconductor layer adjacent the second insulating layer; each of the first doped semiconductor layer and the second doped semiconductor layer includes a doped crystalline or polycrystalline silicon layer having a thickness between approximately 20 μm and 30 μm; each of the first insulating layer and the second insulating layer includes a silicon dioxide layer having a thickness between approximately 0.7 μm and 1.2 μm; each of the first doped primary semiconductor substrate and the second doped primary semiconductor substrate includes a doped silicon substrate having a thickness between approximately 500 μm and 700 μm; the eutectic metal layer includes an alloy of one of aluminum/germanium, gold/silicon, or copper/tin having a thickness less than a thickness of the first insulating layer; each of the plurality of electrostatic pick-offs includes a doped crystalline or polycrystalline silicon layer having a thickness between approximately 20 μm and 30 μm; and each of the plurality of flexures includes a doped crystalline or polycrystalline silicon layer having a thickness between approximately 20 µm and 30 µm.

In yet other inertial sensing devices, the proof mass is generally circular or polygonal with a diameter between approximately 5 mm and 8 mm; N is an integer between three and 48; each of the N proof mass interlocking tabs and each of the N frame interlocking tabs extends between approximately 50 µm and 200 µm in the radial direction and extends between approximately 50 µm and 200 µm in the angular direction; a trench between the proof mass and the frame has a width between approximately 60 µm and 100 µm; each of the plurality of flexures has a width between approximately 100 µm and 500 µm; a spacing between each of the plurality of flexures and the proof mass in the radial direction is between approximately 3 µm and 30 µm and a spacing between each of the plurality of flexures and the frame in the radial direction is between approximately 3 µm and 30 µm; each of the N proof mass interlocking tabs includes one or more dimples on a corresponding surface thereof (the one or more dimples minimizing stiction between the N proof mass interlocking tabs and the N frame interlocking tabs); and each of the N frame interlocking tabs includes one or more dimples on a corresponding surface thereof (the one or more dimples minimizing stiction between the N proof mass interlocking tabs and the N frame interlocking tabs).

In still other inertial sensing devices, the inertial sensing device further comprises one or more electrostatic actuators (the one or more electrostatic actuators levitating the proof mass within the frame); each of the one or more electrostatic actuators includes a comb drive; and each of the plurality of flexures includes a corresponding one of the one or more electrostatic actuators.

In at least one embodiment of the present invention, a method for fabricating an inertial sensing device comprises the steps of providing starting material (the starting material including a doped primary semiconductor substrate, an insulating layer adjacent the primary semiconductor substrate, and a doped semiconductor layer adjacent the insulating layer), defining a plurality of flexures and a plurality of electrostatic pick-offs in the doped semiconductor layer, defining a plurality of flexure contacts and a plurality of electrostatic pick-off contacts in a contact metal layer (the contact metal layer adjacent the doped semiconductor layer), defining a eutectic metal layer (the eutectic metal layer adjacent the doped primary semiconductor substrate), defining a proof mass and a frame by etching a trench through the doped primary semiconductor substrate (the proof mass including N proof mass interlocking tabs formed around a periphery of the proof mass where N is an integer greater than 1, and N proof mass recesses formed around the periphery of the proof mass, the frame including an orifice therethrough, N frame interlocking tabs formed around a periphery of the orifice, each of the N frame interlocking tabs fitting in a respective one of the N proof mass recesses, N frame recesses formed around the periphery of the orifice, each of the N proof mass interlocking tabs fitting in a respective one of the N frame recesses, and a plurality of electrostatic pick-offs formed around the periphery of the orifice), bonding together a pair of the proof masses and a pair of the frames using the eutectic metal layer, and etching a plurality of cavities in the insulating layer beneath the plurality of flexures and the plurality of electrostatic pick-offs.

Features from any of the disclosed embodiments may be used in combination with one another, without limitation. In addition, other features and advantages of the present disclosure will become apparent to those of ordinary skill in the art through consideration of the following detailed description and the accompanying drawings.

BRIEF DESCRIPTION OF THE DRAWINGS

The drawings illustrate several embodiments of the invention, wherein identical reference numerals refer to identical or similar elements or features in different views or embodiments shown in the drawings. The drawings are not to scale and are intended only to illustrate the elements of various embodiments of the present invention.

FIG. 3A illustrates a cross-section of a MEMS inertial sensing device, while

DETAILED DESCRIPTION

Device Structure

Figure 1:
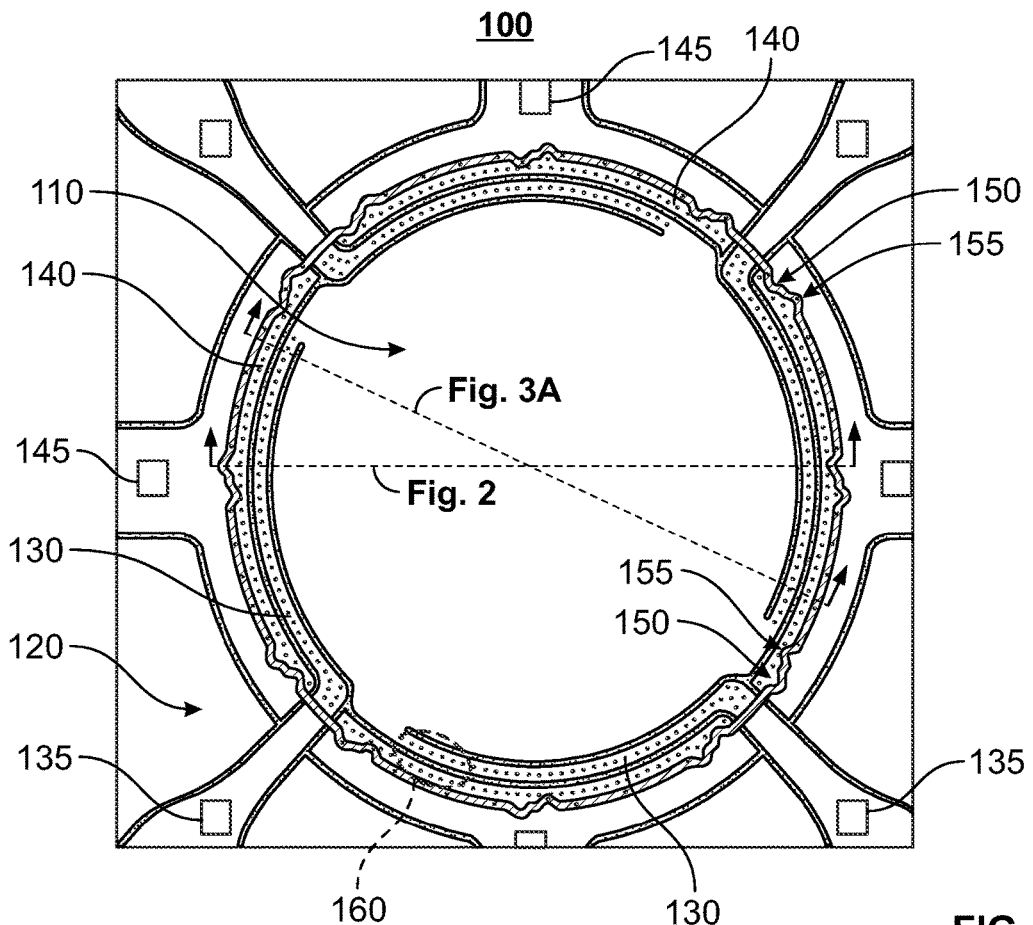
FIG. 1 illustrates a top down view of a MEMS inertial sensing device in accordance with one or more embodiments of the present invention.

FIG. 1 illustrates a top down view of a MEMS inertial sensing device 100 in accordance with one or more embodiments. The device 100 includes a central large proof mass 110 having a generally circular shape, though other embodiments may have a different shape, for example, they may be polygonal. Surrounding the proof mass 110 is a frame 120 having a generally circular orifice therethrough in which the proof mass 110 is suspended via a set of four flexures 130. Each of the four flexures 130 includes a corresponding flexure contact pad 135. The frame 120 includes a set of four electrostatic pick-offs 140 that overlap the proof mass 110, as will be described below with reference to FIG. 2. Each of the four electrostatic pick-offs 140 includes a corresponding electrostatic pick-up contact pad 145. The perimeter of the proof mass 110 and the frame 120 include a series of interlocking tabs 150 and corresponding recesses 155 into which the interlocking tabs 150 fit. The interlocking tabs 150 and corresponding recesses 155 will be described below with reference to FIGS. 3A and 3B. The device 100 includes many small etch openings 160 through the flexures 130 and the electrostatic pick-offs 140. The small etch openings 160 will be described below with reference to FIGS. 5A-5G.

Figure 2:
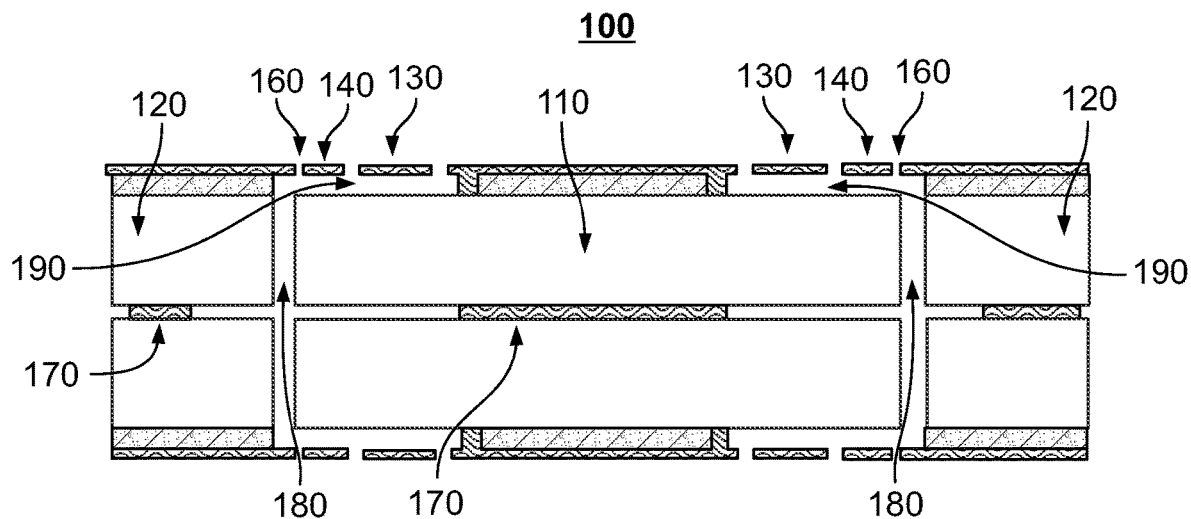
FIG. 2 illustrates a cross-section of a MEMS inertial sensing device in accordance with one or more embodiments of the present invention.
Figure 3A:
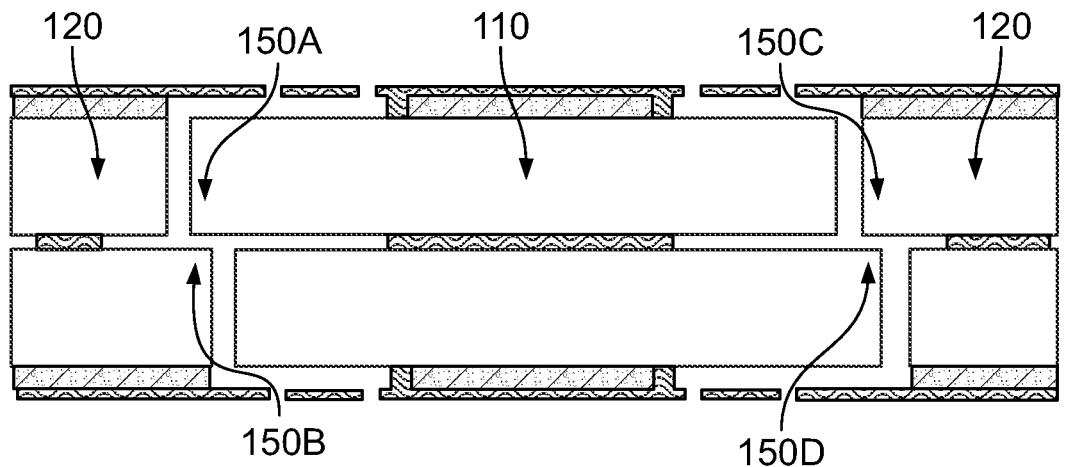

FIG. 2 illustrates a cross-section of the MEMS inertial sensing device 100 illustrated in FIG. 1. The device 100 includes two halves that are identical to each other (though in other embodiments the two halves may be mirror images of each other) and are bonded together back-to-back at a bond line by a eutectic metal layer 170. The proof mass 110 and the frame 120 are formed from the substrate of a starting wafer, with the overall fabrication process described below with respect to FIGS. 5A-5G. A trench 180 is formed between the proof mass 110 and the frame 120 while the flexures 130 and the electro-static pick-offs 140 are formed over a cavity 190. Trench 180 is mirrored across the vertical center line such that when bonded back-to-back, each interlocking tab 150 and recess 155 on one wafer overlap with corresponding features on the other, as illustrated in FIG. 3A. This enables the proof mass 110 to move within the frame 120 in a direction normal to the plane of the frame 120, i.e., in the vertical direction as illustrated in FIG. 2. While the flexures 130 are compliant and readily allow motion of the proof mass 110 in the direction normal to the plane of the frame 120, the flexures 130 are much stiffer in a direction parallel to the plane of the frame 120. Thus, the flexures 130 keep the proof mass 110 centered within the frame 120 in the direction parallel to the plane of the frame 120, i.e., in the horizontal direction as illustrated in FIG. 2.

Figure 3B:
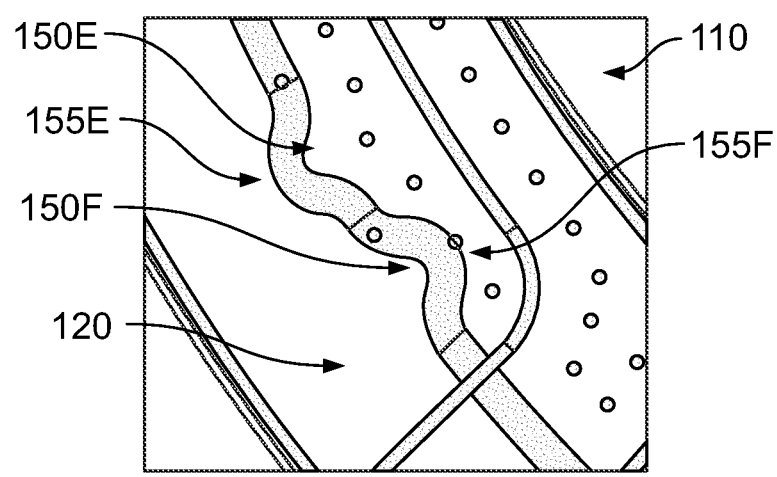
FIG. 3B is an expanded top down view of a pair of interlocking tabs and corresponding recesses in accordance with one or more embodiments of the present invention.

FIG. 3A illustrates a different cross-section of the MEMS inertial sensing device 100 illustrated in FIG. 1, while FIG. 3B is an expanded view of a pair of the interlocking tabs 150 and corresponding recesses 155 into which the interlocking tabs 150 fit. As illustrated in FIG. 3A, an interlocking tab 150A projecting radially out from the proof mass 110 toward the frame 120 fits into a corresponding recess in the frame 120 and overlaps a corresponding interlocking tab 150B projecting radially in from the frame 120 toward the proof mass 110. The interlocking tab 150B fits into a corresponding recess in the proof mass 110. On the opposite side of the proof mass 110, the interlocking tabs configuration is reversed. Specifically, an interlocking tab 150C projecting radially in from the frame 120 toward the proof mass 110 fits into a corresponding recess in the proof mass 110 and overlaps a corresponding interlocking tab 150D projecting radially out from the proof mass 110 toward the frame 120. The interlocking tab 150D fits into a corresponding recess in the frame 120. As illustrated in FIG. 3A, the interlocking tabs 150A-150D thus horizontally fit into corresponding recesses, while the interlocking tabs 150A-150D vertically overlap corresponding interlocking tabs 150A-150D.

The combination of FIGS. 3A and 3B illustrates that interlocking tabs and corresponding recesses come in sets of fours: offset in a direction normal to the plane of the frame 120 (FIG. 3A) as well as offset in an angular direction about the normal to the plane of the frame 120 (FIG. 3B). As illustrated in FIG. 3B, an interlocking tab 150E that projects radially out from the proof mass 110 toward the frame 120 is adjacent to an interlocking tab 150F that projects radially in from the frame 120 toward the proof mass 110. FIG. 3B illustrates two adjacent interlocking tabs 150E, 150F related to the top half of the device 100. FIG. 3B also illustrates the corresponding recesses 155E, 155F into which the interlocking tabs 150E, 150F, respectively, fit in the top half of the device 100. The bottom half of the device 100 will likewise have two adjacent, but complimentary interlocking tabs and corresponding recesses (not illustrated). While FIG. 1 illustrates twelve pairs of interlocking tabs 150 and corresponding recesses 155, this is for the top half of the device 100, thus the device 100 includes a total of 24 pairs of interlocking tabs 150 and corresponding recesses 155. While the device 100 illustrated in FIG. 1 includes 24 pairs of interlocking tabs 150 and corresponding recesses 155, other embodiments may have between three pairs of interlocking tabs/recesses and 48 pairs of interlocking tabs/recesses, with the number of pairs of interlocking tabs and corresponding recesses preferably being a function of the diameter of the proof mass 110.

Figure 4A:
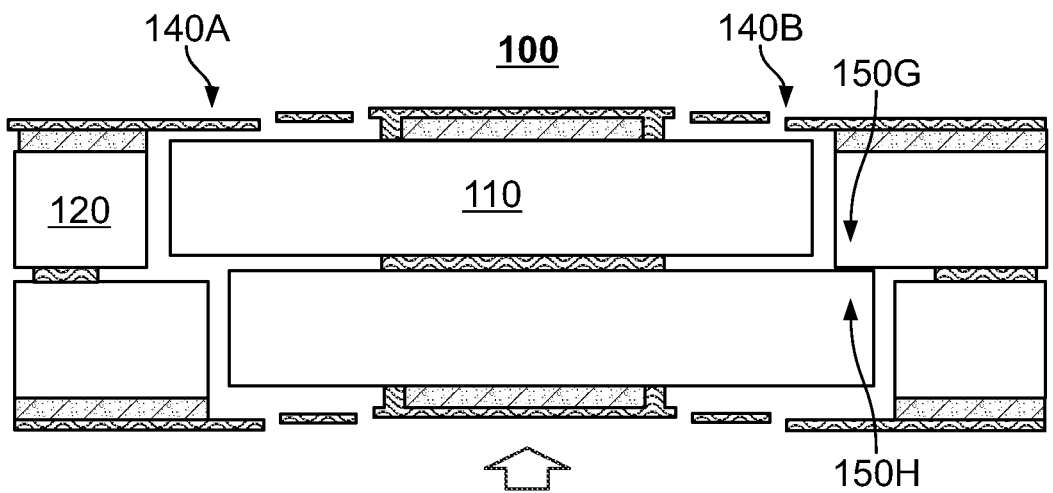
FIGS. 4A-4C illustrate cross-sections of a MEMS inertial sensing device with different offsets in accordance with one or more embodiments of the present invention.
Figure 4B:
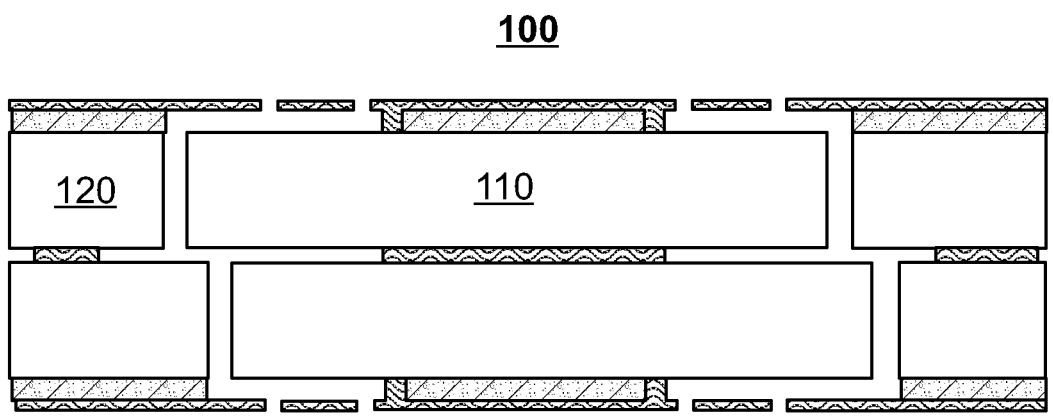
Figure 4C:
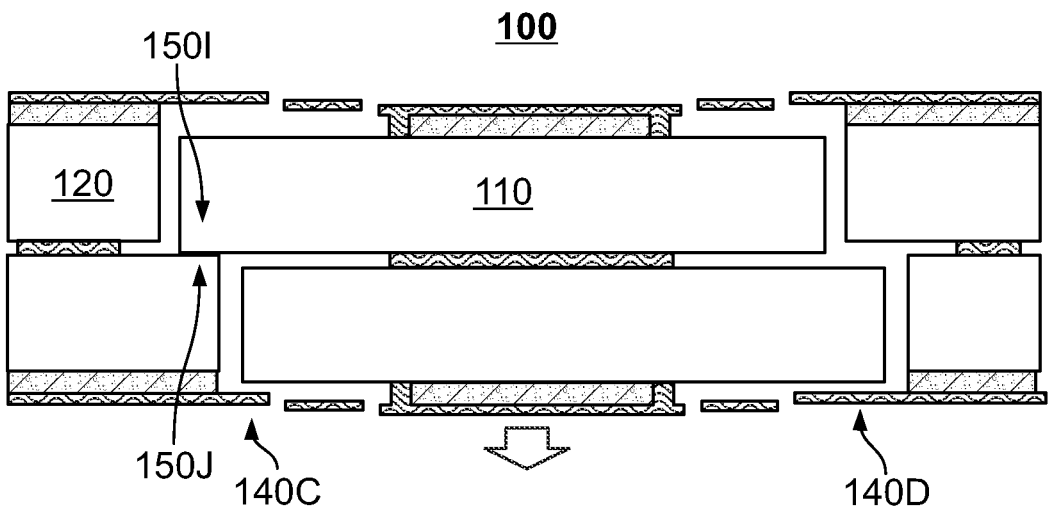

FIGS. 4A-4C illustrate cross-sections of the MEMS inertial sensing device 100 illustrated in FIG. 1 with different offsets in a direction normal to the plane of the frame 120. In FIG. 4A, the proof mass 110 is offset in the "up" direction. The upward movement of the proof mass 110 is limited by the interference of the interlocking tab 150G, which projects radially in from the frame 120 toward the proof mass 110, with the interlocking tab 150H, which projects radially out from the proof mass 110 toward the frame 120. This interference between the interlocking tabs 150G, 150H keeps the perimeter of the proof mass 110 from hitting and thus almost certainly damaging the electrostatic pick-offs 140A, 140B. In FIG. 4B, the proof mass 110 is in its neutral position, i.e., it is not offset in either the "up" or "down" direction relative to the frame 120. In FIG. 4C, the proof mass 110 is offset in the "down" direction. The downward movement of the proof mass 110 is limited by the interference of the interlocking tab 150I, which projects radially out from the proof mass 110 toward the frame 120, with the interlocking tab 150J, which projects radially in from the frame 120 toward the proof mass 110. This interference between the interlocking tabs 150I, 150J keeps the perimeter of the proof mass 110 from hitting and thus almost certainly damaging the electrostatic pick-offs 140C, 140D.

Device Fabrication

Figure 5A:
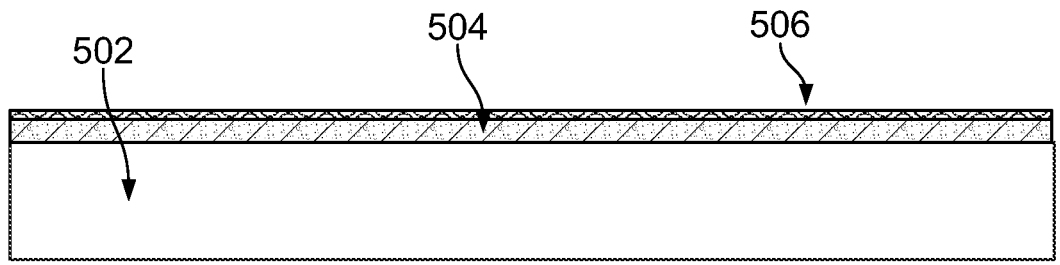
FIGS. 5A-5H illustrate a cross-sectional processing sequence in accordance with at least one embodiment of the present invention.

FIGS. 5A-5H illustrate a cross-sectional processing sequence in accordance with at least one embodiment for fabricating a MEMS inertial sensing device. As the top and bottom halves of the device are identical, FIGS. 5A-5F apply to both the top and bottom halves. FIG. 5A illustrates the starting material 500 employed in fabricating a device. The starting material 500 is a semiconductor on insulator, i.e., SOI, substrate having a doped primary semiconductor substrate 502, an insulating layer 504, and a top doped semiconductor layer 506.

Figure 5B:
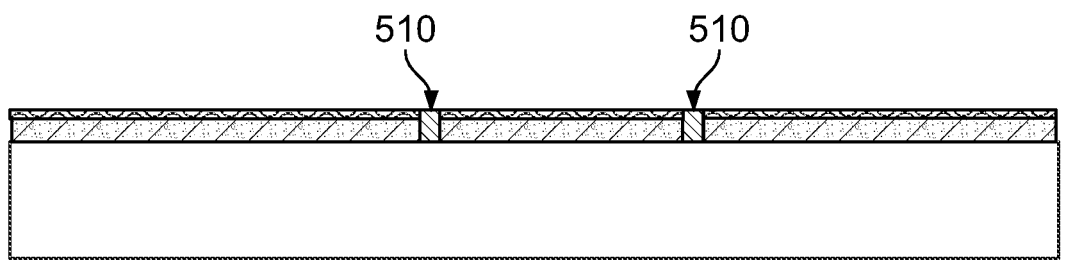

FIG. 5B illustrates the fabrication of doped silicon interconnects 510 that provide electrical continuity between the top doped semiconductor layer 506 and the portion of the primary semiconductor substrate 502 that will become the proof mass 110. The doped silicon interconnects 510 are formed by etching openings in the insulating layer 504 and the top doped semiconductor layer 506. The openings are then backfilled with doped silicon and the surface planarized down to the top doped semiconductor layer 506.

Figure 5C:
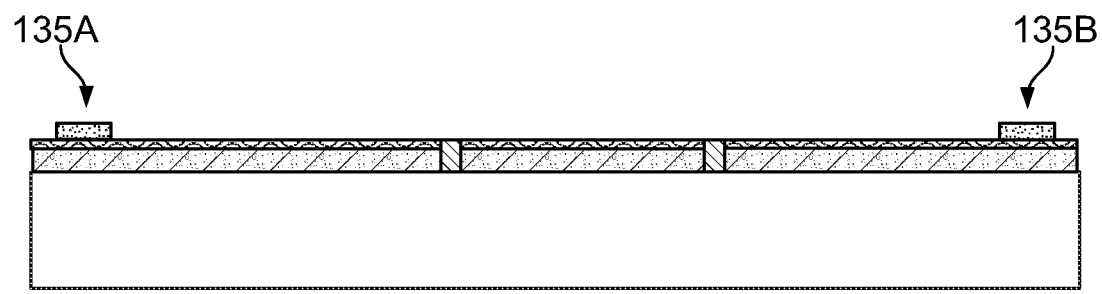

FIG. 5C illustrates the formation of the flexure contact pads 135A, 135B. The electrostatic pick-up contact pads (145A, 145B, not illustrated) will similarly be formed by the same process used to form the flexure contact pads 135A, 135B. Electrical continuity between the flexure contact pads 135A, 135B and the portion of the primary semiconductor substrate 502 that will become the proof mass 110 is via the top doped semiconductor layer 506, which will be patterned in subsequent steps to form the flexures 130. In like manner, electrical continuity between the electrostatic contact pads 145A, 145B and the electrostatic pick-offs 140A, 140B is via the top doped semiconductor layer 506, which will be patterned in subsequent steps to form the electrostatic contact pads 145A, 145B.

Figure 5D:
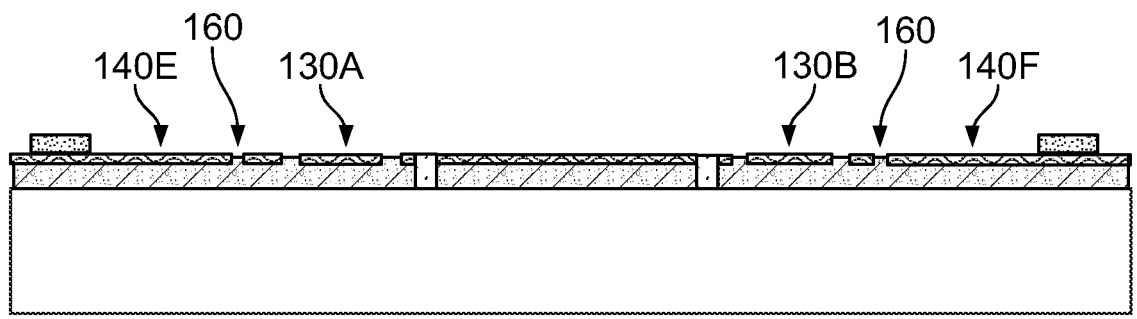

FIG. 5D illustrates the patterning, via etching of the top doped semiconductor layer 506, to define the flexures 130A, 130B, the electrostatic pick-offs 140E, 140F, and the many small etch openings 160.

Figure 5E:
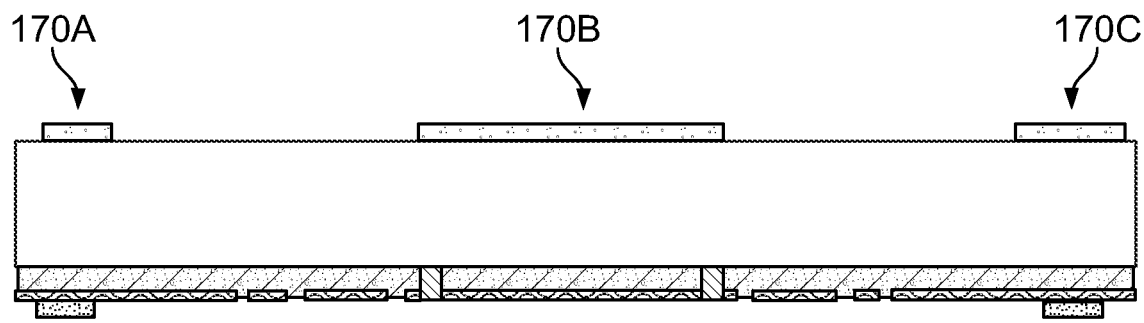

FIG. 5E illustrates the eutectic metal layer 170A, 170B, 170C formed on the backside surface, i.e., the doped primary semiconductor substrate 502, of the starting material 500.

Figure 5F:
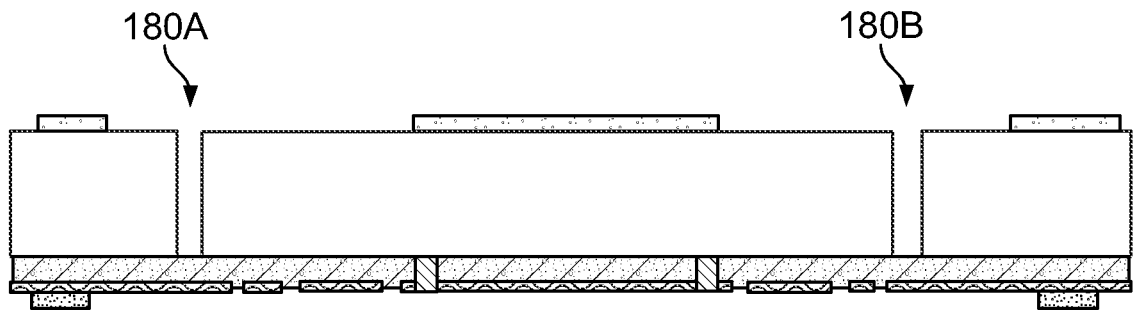

FIG. 5F illustrates the trench 180A, 180B that encircles and defines the proof mass 110 relative to the frame 120. The trench 180A, 180B also defines the interlocking tabs 150 and the corresponding recesses 155 into which the interlocking tabs 150 fit.

Figure 5G:
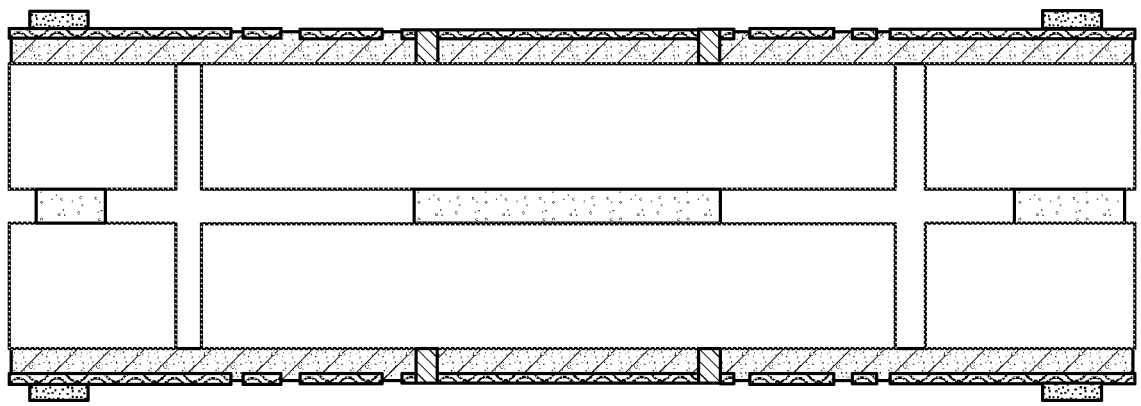

FIG. 5G illustrates the partially completed MEMS inertial sensing device after the upper and lower halves have been bonded together using the eutectic metal layer 170A, 170B, 170C.

Figure 5H:
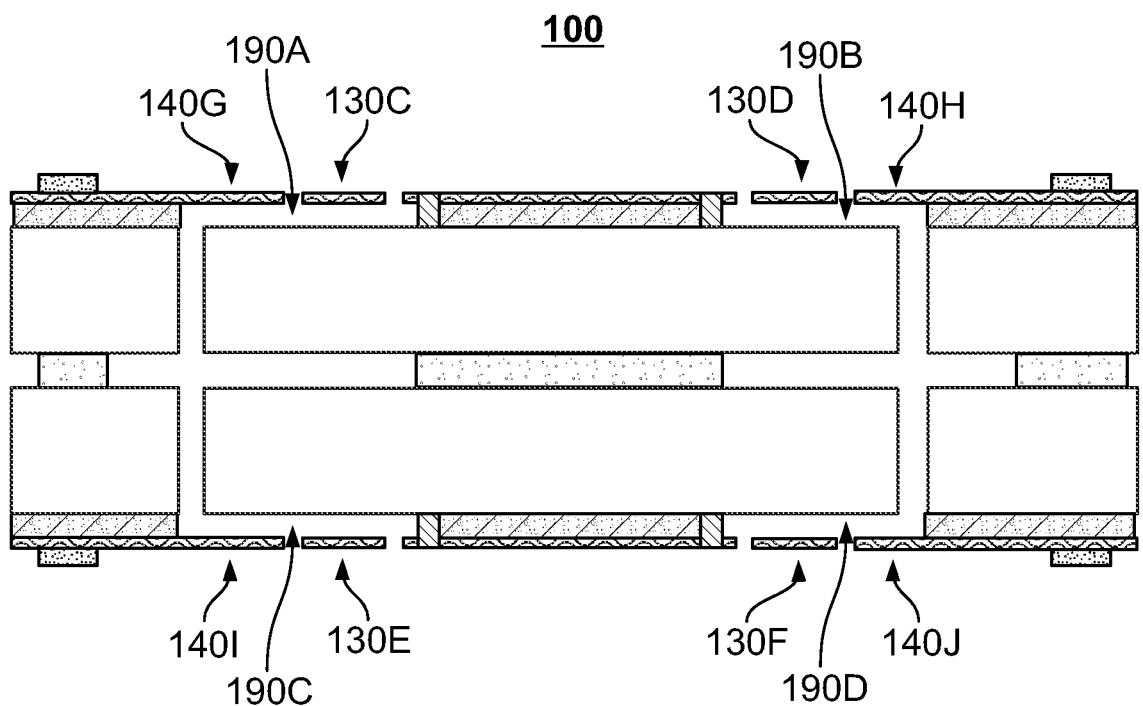

FIG. 5H illustrates the completed MEMS inertial sensing device 100 after the cavities 190A-190D have been etched. The cavities 190A-190D are etched through the openings on either side of the flexures 130C-130F and the many small etch openings 160, with the many small etch openings 160 permitting sufficient lateral removal of the insulating layer 504 to form the cavities 190A-190D below the flexures 130C-130F and the electrostatic pick-offs 140G-140J.

Figure 6:
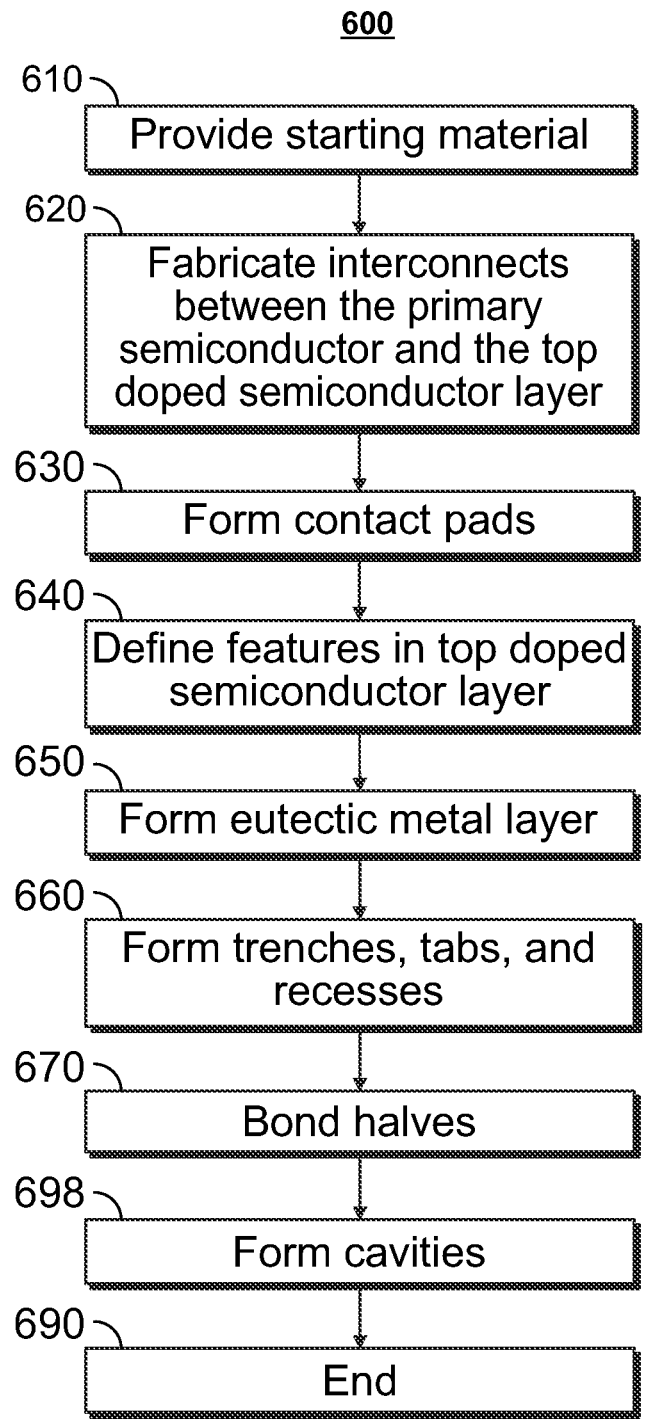
FIG. 6 illustrates a flow chart of a processing sequence in accordance with at least one embodiment of the present invention.

FIG. 6 illustrates a flow chart corresponding to the cross-sectional processing sequence discussed above with reference to FIG. 5A-5H. The processing sequence 600 begins in step 610 by providing the starting material. In step 620, a mask, an etch, deposition of a conformal conductor, and planarization processes are used to form the interconnects between the primary semiconductor substrate and the top doped semiconductor layer. In step 630, a contact metal layer is deposited and patterned to form the flexure contact pads and the electrostatic pick-off contact pads. In step 640, a mask and an etch are used to define the flexures, the electrostatic pick-offs, and the many small etch openings in the top doped semiconductor layer.

In step 650, a eutectic metal layer is deposited and patterned on the backside surface of the starting material. In step 660, a mask and an etch are used to form the trench that encircles and defines the proof mass relative to the frame, the trench extending through the doped primary semiconductor substrate. Step 660 also forms the interlocking tabs and corresponding recesses. In step 670, upper and lower halves are bonded together using the eutectic metal layer. In step 680, the cavities are etched below the flexures and the electrostatic pick-offs. The processing sequence 600 ends in step 690.

While FIGS. 5A-5H and FIG. 6 illustrate a processing sequence in accordance with one or more embodiments, other embodiments may employ a different processing sequence. For example, various processing steps may be undertaken in a different order, various processing steps may be undertaken simultaneously, various processing steps may be omitted, or various processing steps may be added. As a specific example, the etching of step 640 may be undertaken after the bonding of the halves in step 670 to preserve the integrity of the halves as the required bonding forces may be high.

The starting material may be any suitable type of material. The starting material may, for example, be a doped primary semiconductor substrate, for example, an n-type doped silicon wafer, on which an insulating layer has been formed, with a doped semiconductor layer, for example, an n-type doped crystalline or polycrystalline silicon layer, formed thereon. SOI wafers of this type are commercially available. The doped primary semiconductor substrate may have any suitable thickness, though greater sensitivity may be achieved by employing a thicker doped primary semiconductor substrate to form the proof mass. For this reason, the doped primary semiconductor substrate may, for example, have a thickness in the range of approximately 500 μm to 700 μm. The insulating layer may have any suitable thickness, though the thickness of the insulating layer determines the range of motion of the proof mass. For this reason, the insulating layer may, for example, have a thickness in the range of approximately 0.7 μm to 1.2 μm. The insulating layer may be formed, for example, of silicon dioxide. The doped semiconductor layer may have any suitable thickness, though the thickness of the doped semiconductor layer determines the compliance of the flexures and the conductivity of the doped semiconductor layer. For these reasons, the doped semiconductor layer may, for example, have a thickness in the range of approximately 20 μm to 30 μm.

The contact metal layer may have any suitable composition and thickness. For example, the contact metal layer may be formed of aluminum, an aluminum alloy (for example $Al_{0.95}Cu_{0.05}$), or gold depending upon subsequent processing steps. The contact metal layer may, for example, have a thickness of approximately 1.0 μm. The eutectic metal layer may have any suitable composition, but its thickness is predetermined. For example, the eutectic metal layer may be formed of aluminum/germanium, gold/silicon, or copper/tin. The thickness of the eutectic metal layer is determined by the thickness of the insulating layer and should be less than approximately one half of the thickness of the insulating layer for each half of the device when deposited. The net result for the final device after both halves of the device have been bonded together is that the total thickness of the bonded eutectic metal layer is less than the thickness of the insulating layer. If the total thickness of the bonded eutectic metal layer is equal to or greater than the thickness of the insulating layer, then the proof mass may hit and thus almost certainly damage the electrostatic pick-offs.

The proof mass may have any suitable diameter. As a larger proof mass will provide greater device sensitivity, larger diameters may be preferred in certain applications. For example, the proof mass may have a diameter between approximately 5 mm and 8 mm. The flexures may have any suitable width, subject to being able to safely tether the proof mass to the frame. The flexures may, for example, have a width between approximately 100 μm and 500 μm. The spacing between the flexures and the proof mass as well as the spacing between the flexures and the frame in the radial direction may have suitable width. These spacings may, for example, be between approximately 3 μm and 30 μm. The trench may have any suitable width. The trench may, for example, have a width between approximately 60 μm and 100 μm. The interlocking tabs may extend any suitable distance in the radial direction from the periphery of the proof mass, subject to being strong enough to stop the proof mass from hitting the electrostatic pick-offs. The interlocking tabs may, for example, extend between approximately 50 μm and 200 μm in the radial direction. The interlocking tabs may extend any suitable distance in the angular direction about the periphery of the proof mass. The interlocking tabs may, for example, extend between approximately 50 μm and 200 μm in the angular direction. The corresponding recesses into which the interlocking tabs fit will have dimensions complimentary to those of the interlocking tabs. The many small etch openings may have any suitable size, subject to being large enough to permit lateral etching of the cavities. For example, the diameter of the many small etch openings may be between approximately 5 μm and 30 μm. The flexure contact pads and the electrostatic pick-up contact pads may have any suitable size. For example, the flexure contact pads and the electrostatic pick-up contact pads may be square or round and between approximately 50 µm and 500 µm across.

Etching to define the flexures, the electrostatic pick-offs, the many small etch openings, and the contact openings in the top doped semiconductor layer may employ any suitable etching process. The etching process may, for example, employ either a wet or a dry etch, though a dry etch process, such as reactive ion etching (RIE), is preferred. Etching to define the trench that encircles and defines the proof mass relative to the frame may employ any suitable etching process. Given the thickness of the substrate, the etching process may, for example, employ deep reactive ion etching (DRIE). Bonding the upper and lower halves together using the eutectic metal layer may employ any suitable bonding process. The bonding process may, for example, employ both heat and pressure, with the temperature sufficiently high to melt the eutectic metal and the pressure sufficiently high to ensure a uniform bond line across the device. Etching to define the cavities in the insulating layer may employ any suitable isotropic etching process. The etching process may, for example, employ a wet chemical etch, such as hydrofluoric acid.

Device Operation

The electrostatic pick-offs 140 of the MEMS inertial sensing device 100 remain in a fixed physical relationship with the frame 120, while the proof mass 110 moves within the frame 120 in a direction normal to the plane of the frame 120. Thus, the spacing between the electrostatic pick-offs 140 and the proof mass 110 changes as the proof mass 110 moves in a direction normal to the plane of the frame 120. As both the proof mass 110 and the electrostatic pick-offs 140 are formed of conductive material, variable capacitance capacitors are formed by the proof mass 110, the electrostatic pick-offs 140, and the intervening cavities 190. The instantaneous capacitances of these capacitors are determined by the spacing between the proof mass 110 and the electrostatic pick-offs 140. By monitoring the instantaneous capacitance of these capacitors, one can determine the location of the proof mass 110, and thus the magnitude and direction of any inertial force that has caused the proof mass 110 to move.

As will be appreciated by one of ordinary skill, by including electrostatic pick-offs 140 on both the top and bottom halves of the device 100, one can improve sensitivity by using differential detection. For example, if the proof mass 110 rises, the instantaneous capacitances of the capacitors in the top half of the device 100 (the upper capacitance) increase as the distance between the proof mass 110 and the electrostatic pick-offs 140 decreases. Conversely, when the proof mass 110 rises, the instantaneous capacitances of the capacitors in the bottom half of the device 100 (the lower capacitance) will decrease as the distance between the proof mass 110 and the electrostatic pick-offs 140 increases. Therefore, by measuring the difference between the upper and lower capacitance, one can double the sensitivity of the device 100, while removing common mode noise. Operating the device 100 in this passive manner may be termed open loop operation.

In contrast, a MEMS inertial sensing device may be operated in an active manner, which may also be termed closed loop operation. The goal of closed loop operation is to keep the proof mass centered, i.e., levitated to its neutral position as illustrated in FIG. 4B. An error, or corresponding control, signal corresponds to the difference between the instantaneous upper capacitance and the instantaneous lower capacitance. When the proof mass is in its neutral position, the difference between the instantaneous upper capacitance and the instantaneous lower capacitance is zero, indicating no error. However, when the proof mass is not in its neutral position, there will be a difference between the instantaneous upper capacitance and the instantaneous lower capacitance, and thus a non-zero error signal will be generated. This non-zero error signal can be used as a control signal to drive the proof mass back to its neutral position. This error (control) signal is thus an indication of the inertial forces acting on the proof mass that must be counter-balanced to keep the proof mass in its neutral position. The larger the error (control) signal is, the greater the inertial force acting upon the proof mass.

A closed loop operating MEMS inertial sensing device differs from that of an open loop operating MEMS inertial sensing device. Specifically, the closed loop operating device may include additional elements that are used to levitate the proof mass. The pick-off electrodes may be used for sensing, driving (i.e., levitation), or both, for example, the odd pick-off electrodes are used for sensing while the even pick-off electrodes are used for driving. Alternative embodiments may, for example, employ one or more electrostatic actuators to levitate the proof mass. Electrostatic actuators include, for example, comb drives, in which like charges will repel and opposite charges will attract, thereby enabling levitation of the proof mass within the frame. See J. Wooldridge et al., "Finite Element Analysis of the Vertical Levitation Force in an Electrostatic MEMS Comb Drive Actuator," Journal of Physics: Conference Series, vol. 472, art. no. 012002 (2013), the contents of which are incorporated herein by reference. This architecture is also compatible with electromagnetic levitation, in which an electromagnetic drive coil and a magnetic yoke are used to provide force-feedback.

Closed loop operation of a MEMS inertial sensing device offers at least one advantage over open loop operation. Specifically, the levitation of the proof mass allows it to sense greater inertial forces than possible with an open loop operating device. An inertial force that is great enough for interlocking tabs to interfere in an open loop operating device can be countered by the levitation force in closed loop operation, thereby extending the operating range of the closed loop operating device to include greater inertial forces.

Device Variations

Figure 7:
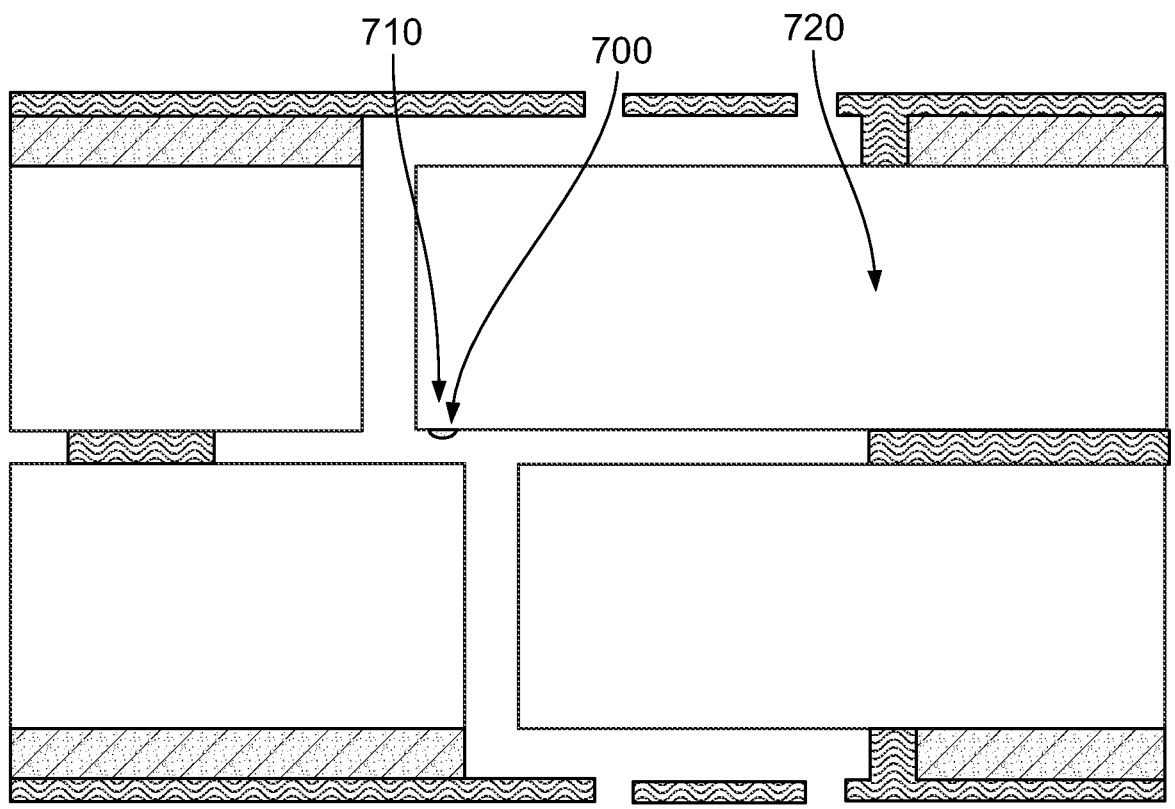
FIG. 7 illustrates dimples formed on a surface of an interlocking tab on the periphery of a proof mass in accordance with at least one embodiment of the present invention.

When interlocking tabs interfere, this runs the risk that the proof mass will not release from the frame due to stiction at the points of interference on the interlocking tabs. One way to reduce the likelihood of stiction is to form dimples on the surfaces of the interlocking tabs that will interfere. FIG. 7 illustrates an embodiment in which one or more dimples 700 are formed on a surface of each interlocking tab 710 on the periphery of a proof mass 720. In other embodiments, the dimples are formed on a corresponding surface of an interlocking tab on the inner periphery of the frame. The dimples may, for example, be formed in an optional step before or after steps 640 or 650 in the processing sequence discussed above with reference to FIG. 6.

The invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

The invention claimed is:

1. An inertial sensing device comprising:
a proof mass, the proof mass including:
N proof mass interlocking tabs formed around a periphery of the proof mass, where N is an integer greater than 1; and
N proof mass recesses formed around the periphery of the proof mass;
a frame, the frame including:
an orifice therethrough;
N frame interlocking tabs formed around a periphery of the orifice, each of the N frame interlocking tabs adapted to fit in a respective one of the N proof mass recesses;
N frame recesses formed around the periphery of the orifice, each of the N proof mass interlocking tabs adapted to fit in a respective one of the N frame recesses; and
a plurality of electrostatic pick-offs formed around the periphery of the orifice; and
a plurality of flexures, a first end of each of the plurality of flexures coupled to the proof mass, a second end of each of the plurality of flexures coupled to the frame, the plurality of flexures adapted to allow motion of the proof mass in a direction normal to a plane of the frame, the plurality of flexures adapted to inhibit motion of the proof mass in a direction parallel to the plane of the frame.

2. The inertial sensing device of claim 1, wherein each of the proof mass and the frame includes:
a first doped semiconductor layer;
a first insulating layer adjacent the first doped semiconductor layer;
a first doped primary semiconductor substrate adjacent the first insulating layer;
a eutectic metal layer adjacent the first doped primary semiconductor substrate;
a second doped primary semiconductor substrate adjacent the eutectic metal layer;
a second insulating layer adjacent the second doped primary semiconductor substrate; and
a second doped semiconductor layer adjacent the second insulating layer.

3. The inertial sensing device of claim 2, wherein each of the first doped semiconductor layer and the second doped semiconductor layer includes a doped crystalline or polycrystalline silicon layer having a thickness between approximately 20 µm and 30 µm.

4. The inertial sensing device of claim 2, wherein each of the first insulating layer and the second insulating layer includes a silicon dioxide layer having a thickness between approximately 0.7 µm and 1.2 µm.

5. The inertial sensing device of claim 2, wherein each of the first doped primary semiconductor substrate and the second doped primary semiconductor substrate includes a doped silicon substrate having a thickness between approximately 500 µm and 700 µm.

6. The inertial sensing device of claim 2, wherein the eutectic metal layer includes an alloy of one of aluminum/germanium, gold/silicon, or copper/tin having a thickness less than a thickness of the first insulating layer.

7. The inertial sensing device of claim 2, wherein each of the plurality of electrostatic pick-offs includes a doped crystalline or polycrystalline silicon layer having a thickness between approximately 20 µm and 30 µm.

8. The inertial sensing device of claim 2, wherein each of the plurality of flexures includes a doped crystalline or polycrystalline silicon layer having a thickness between approximately 20 µm and 30 µm.

9. The inertial sensing device of claim 1, wherein the proof mass is generally circular or polygonal with a diameter between approximately 5 mm and 8 mm.

10. The inertial sensing device of claim 1, wherein N is an integer between three and 48.

11. The inertial sensing device of claim 1, wherein each of the N proof mass interlocking tabs and each of the N frame interlocking tabs extends between approximately 50 µm and 200 µm in the radial direction and extends between approximately 50 µm and 200 µm in the angular direction.

12. The inertial sensing device of claim 1, wherein a trench between the proof mass and the frame has a width between approximately 60 µm and 100 µm.

13. The inertial sensing device of claim 1, wherein each of the plurality of flexures has a width between approximately 100 µm and 500 µm.

14. The inertial sensing device of claim 1,
wherein a spacing between each of the plurality of flexures and the proof mass in the radial direction is between approximately 3 µm and 30 µm; and
wherein a spacing between each of the plurality of flexures and the frame in the radial direction is between approximately 3 µm and 30 µm.

15. The inertial sensing device of claim 1, wherein each of the N proof mass interlocking tabs includes one or more dimples on a corresponding surface thereof, the one or more dimples adapted to minimize stiction between the N proof mass interlocking tabs and the N frame interlocking tabs.

16. The inertial sensing device of claim 1, wherein each of the N frame interlocking tabs includes one or more dimples on a corresponding surface thereof, the one or more dimples adapted to minimize stiction between the N proof mass interlocking tabs and the N frame interlocking tabs.

17. The inertial sensing device of claim 1 further comprising one or more electrostatic actuators, the one or more electrostatic actuators adapted to levitate the proof mass within the frame.

18. The inertial sensing device of claim 17 wherein each of the one or more electrostatic actuators includes a comb drive.

19. The inertial sensing device of claim 17 wherein each of the plurality of flexures includes a corresponding one of the one or more electrostatic actuators.

20. A method for fabricating an inertial sensing device, the method comprising the steps of:
providing starting material, the starting material including a doped primary semiconductor substrate, an insulating layer adjacent the primary semiconductor substrate, and a doped semiconductor layer adjacent the insulating layer;
defining a plurality of flexures and a plurality of electrostatic pick-offs in the doped semiconductor layer;
defining a plurality of flexure contacts and a plurality of electrostatic pick-off contacts in a contact metal layer, the contact metal layer adjacent the doped semiconductor layer;
defining a eutectic metal layer, the eutectic metal layer adjacent the doped primary semiconductor substrate;
defining a proof mass and a frame by etching a trench through the doped primary semiconductor substrate, the proof mass including N proof mass interlocking tabs formed around a periphery of the proof mass where N is an integer greater than 1, and N proof mass recesses formed around the periphery of the proof mass, the frame including an orifice therethrough, N frame interlocking tabs formed around a periphery of the orifice, each of the N frame interlocking tabs adapted to fit in a respective one of the N proof mass recesses, N frame recesses formed around the periphery of the orifice, each of the N proof mass interlocking tabs adapted to fit in a respective one of the N frame recesses, and a plurality of electrostatic pick-offs formed around the periphery of the orifice;

bonding together a pair of the proof masses and a pair of the frames using the eutectic metal layer; and etching a plurality of cavities in the insulating layer beneath the plurality of flexures and the plurality of electrostatic pick-offs.

\* \* \* \* \*